(12) United States Patent
Burns

(10) Patent No.: US 7,446,532 B1
(45) Date of Patent: Nov. 4, 2008

(54) ARCHED SADDLE-SHAPED NMR RF COILS

(75) Inventor: Sean Burns, Palo Alto, CA (US)

(73) Assignee: Varian, Inc., Palo Alto, CA (US)

( * ) Notice: Subject to any disclaimer, the term of this patent is extended or adjusted under 35 U.S.C. 154(b) by 0 days.

(21) Appl. No.: 11/879,531

(22) Filed: Jul. 18, 2007

(51) Int. Cl.
*G01V 3/00* (2006.01)

(52) U.S. Cl. ..................................... 324/318; 324/322

(58) Field of Classification Search .................. 324/318, 324/322
See application file for complete search history.

(56) References Cited

U.S. PATENT DOCUMENTS

| | | | |
|---|---|---|---|
| 5,323,113 A * | 6/1994 | Cory et al. .................. | 324/318 |
| 5,370,118 A | 12/1994 | Vij et al. | |
| 5,565,780 A | 10/1996 | Derby | |
| 5,760,583 A * | 6/1998 | Sato et al. .................. | 324/318 |
| 5,929,639 A * | 7/1999 | Doty ........................... | 324/318 |
| 6,175,237 B1 * | 1/2001 | Doty et al. .................. | 324/318 |
| 6,218,839 B1 | 4/2001 | Shaikh et al. | |
| 6,265,876 B1 * | 7/2001 | Carrozzi .................... | 324/318 |
| 6,674,285 B2 * | 1/2004 | Haner ......................... | 324/318 |

OTHER PUBLICATIONS

Fuks, et al., "Susceptibility, Lineshape, and Shimming in High Resolution NMR", Journal of Magnetic Resonance 100, 229-242 (1992).
Hoult, et al., "The Signal-to-Noise Ratio of the Nuclear Magnetic Resonance Experiment", Journal of Magnetic Resonance 24, 71-85 (1976).

* cited by examiner

*Primary Examiner*—Louis M Arana
(74) *Attorney, Agent, or Firm*—Bella Fishman; Andrei D. Popovici

(57) ABSTRACT

According to one aspect, a nuclear magnetic resonance (NMR) radio-frequency (RF) coil of an NMR spectrometer includes oppositely-facing arches at opposite longitudinal ends of the coil window, along shielded regions of the coil. The arched coil shapes allow situating the transverse parts of the coil away from the interfaces between the sample measurement volume and coil shields while minimizing the additional coil length and thus coil inductance and capacitance needed to move the transverse conductors away from interfaces. Moving the transverse parts of the coil away from the measurement volume facilitates shimming. The coil may be lifted on a plurality of longitudinal support rods spaced around a circumference of the coil, in order to reduce the capacitance between the coil and associated shields.

23 Claims, 4 Drawing Sheets

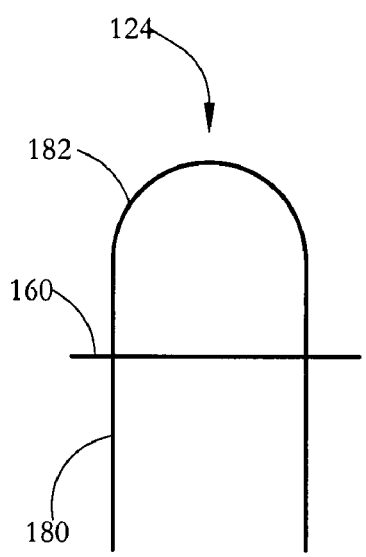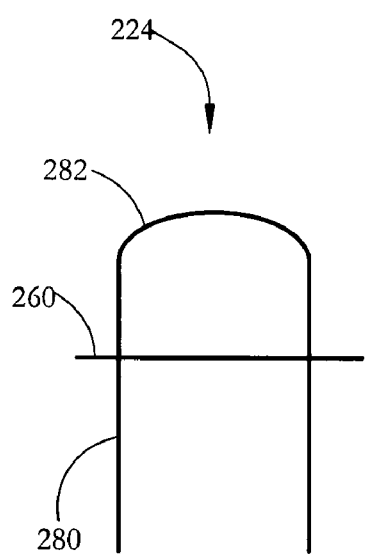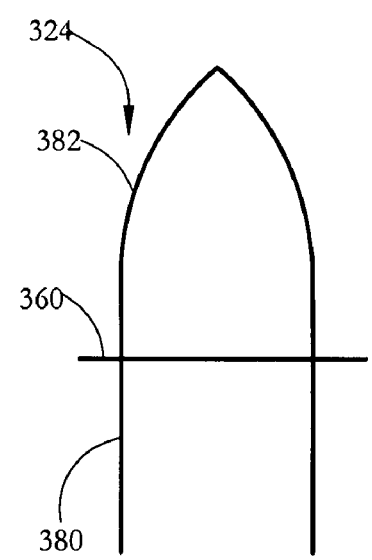
FIG. 4-A  FIG. 4-B  FIG. 4-C

ARCHED SADDLE-SHAPED NMR RF COILS

FIELD OF THE INVENTION

The invention in general relates to nuclear magnetic resonance (NMR) spectroscopy, and in particular to NMR radio-frequency (RF) coils.

BACKGROUND OF THE INVENTION

Nuclear magnetic resonance (NMR) spectrometers typically include a superconducting magnet for generating a static magnetic field $B_0$, and an NMR probe including one or more special-purpose radio-frequency (RF) coils for generating a time-varying magnetic field $B_1$ perpendicular to the field $B_0$, and for detecting the response of a sample to the applied magnetic fields. Each RF coil and associated circuitry can resonate at the Larmor frequency of a nucleus of interest present in the sample. Nuclei of interest analyzed in common NMR applications include $^1H$ (proton), $^{13}C$ (carbon), and $^{15}N$ (nitrogen). The RF coils are typically provided as part of an NMR probe, and are used to analyze samples situated in sample tubes or flow cells. The direction of the static magnetic field $B_0$ is commonly denoted as the z-axis or longitudinal direction, while the plane perpendicular to the z-axis is commonly termed the x-y or transverse direction.

Several types of RF coils have been used in NMR systems. In particular, many NMR systems include transverse-field RF coils, which generate an RF magnetic field oriented along the x-y plane. Transverse-field coils include saddle-shaped coils and birdcage coils. Birdcage coils typically include two transverse rings, and a relatively large number of vertical rungs connecting the rings. Birdcage coils are multiply-resonant structures in which specified phase-relationships are established for current flowing along multiple vertical rungs. Saddle-shaped coils normally have the current path defined by a conductor pattern around the coil windows.

An NMR frequency of interest is determined by the nucleus of interest and the strength of the applied static magnetic field $B_0$. In order to maximize the accuracy of NMR measurements, the resonant frequency of the excitation/detection circuitry is set to be equal to the frequency of interest. The resonant frequency of the excitation/detection circuitry varies as $$v = 1/2\pi\sqrt{LC} \qquad [1]$$

where L and C are the effective inductance and capacitance, respectively, of the excitation/detection circuitry.

Generating high-resolution NMR spectra is facilitated by employing a temporally and spatially-homogeneous static magnetic field. The strength of the static magnetic field can vary over time due to temperature fluctuations or movement of neighboring metallic objects, among others. Spatial variations in the static magnetic field can be created by variations in sample tube or sample properties, the presence of neighboring materials, or by the magnet's design. Minor spatial inhomogeneities in the static magnetic field are ordinarily corrected using a set of shim coils, which generate a small magnetic field which opposes and cancels inhomogeneities in the applied static magnetic field. Shimming is generally facilitated if the various components of an NMR probe introduce minimal inhomogeneities into the static magnetic field.

SUMMARY OF THE INVENTION

According to one aspect, a nuclear magnetic resonance radio frequency coil assembly comprises a coil support, and a saddle-shaped nuclear magnetic resonance radio-frequency coil mounted on the coil support, the radio-frequency coil defining a pair of opposite, laterally-facing coil windows, each coil window including a pair of oppositely-facing arches at opposite longitudinal ends of said each coil window.

According to another aspect, a nuclear magnetic resonance apparatus comprises a magnet for applying a static magnetic field to a sample; a shim coil coupled to the magnet, for reducing a spatial inhomogeneity of the static magnetic field; and a saddle-shaped nuclear magnetic resonance radio-frequency coil coupled to the magnet, for applying a radio-frequency magnetic field to the sample, the radio-frequency coil defining a pair of opposite, laterally-facing coil windows, each coil window including a pair of oppositely-facing arches at opposite longitudinal ends of said each coil window.

According to another aspect, a nuclear magnetic resonance measurement method comprises employing a saddle-shaped nuclear magnetic resonance radio-frequency coil to apply a set of radio-frequency pulses to a sample, the radio-frequency coil defining a pair of opposite, laterally-facing coil windows, each coil window including a pair of oppositely-facing arches at opposite longitudinal ends of said each coil window; and detecting a response of the sample to the set of radio-frequency pulses.

BRIEF DESCRIPTION OF THE DRAWINGS

The foregoing aspects and advantages of the present invention will become better understood upon reading the following detailed description and upon reference to the drawings where:

FIG. 2-B shows an isometric view of a support/shielding structure of the RF coil assembly of FIG. 2-A, according to some embodiments of the present invention.

FIG. 4-A shows an exemplary RF coil arch shape with circular curvature, according to some embodiments of the present invention.

FIG. 4-B shows an exemplary RF coil arch shape having an elliptical curvature, according to some embodiments of the present invention.

FIG. 4-C shows an exemplary RF coil arch shape having an acute arch top, according to some embodiments of the present invention.

DETAILED DESCRIPTION OF THE INVENTION

In the following description, a set of elements includes one or more elements. Any reference to an element is understood to encompass one or more elements. Each recited element or structure can be formed by or be part of a monolithic structure, or be formed from multiple distinct structures. A longitudinally-monolithic foil is a foil that is not formed by connecting multiple longitudinally-separated parts; a longitudinally-monolithic foil may include multiple layers stacked along a non-longitudinal direction. The statement that a coil is used to perform a nuclear magnetic measurement on a sample is understood to mean that the coil is used as transmitter, receiver, or both. Unless otherwise stated, any recited electrical or mechanical connections can be direct connections or indirect connections through intermediary circuit elements or structures. A conductive ring is a structure that provides a ring-shaped current path to RF current; such a structure can include two or three concentric, capacitively-coupled physical rings, some or all of which may include longitudinal slots; such physical rings can be formed, for example, by part of a central foil, a capacitive shield, and a capacitance band. A conductive ring can also include a single, monolithic physical ring providing a ring-shaped path to DC current. The statement that a longitudinal conductor electrically couples two conductive rings is understood to mean that the longitudinal conductor provides a current path for RF current flowing between the two rings. Such a longitudinal conductor can be physically (resistively) connected to one or both of the rings (providing both DC and RF current paths), or capacitively coupled to one or both of the rings.

The following description illustrates embodiments of the invention by way of example and not necessarily by way of limitation.

Figure 1:
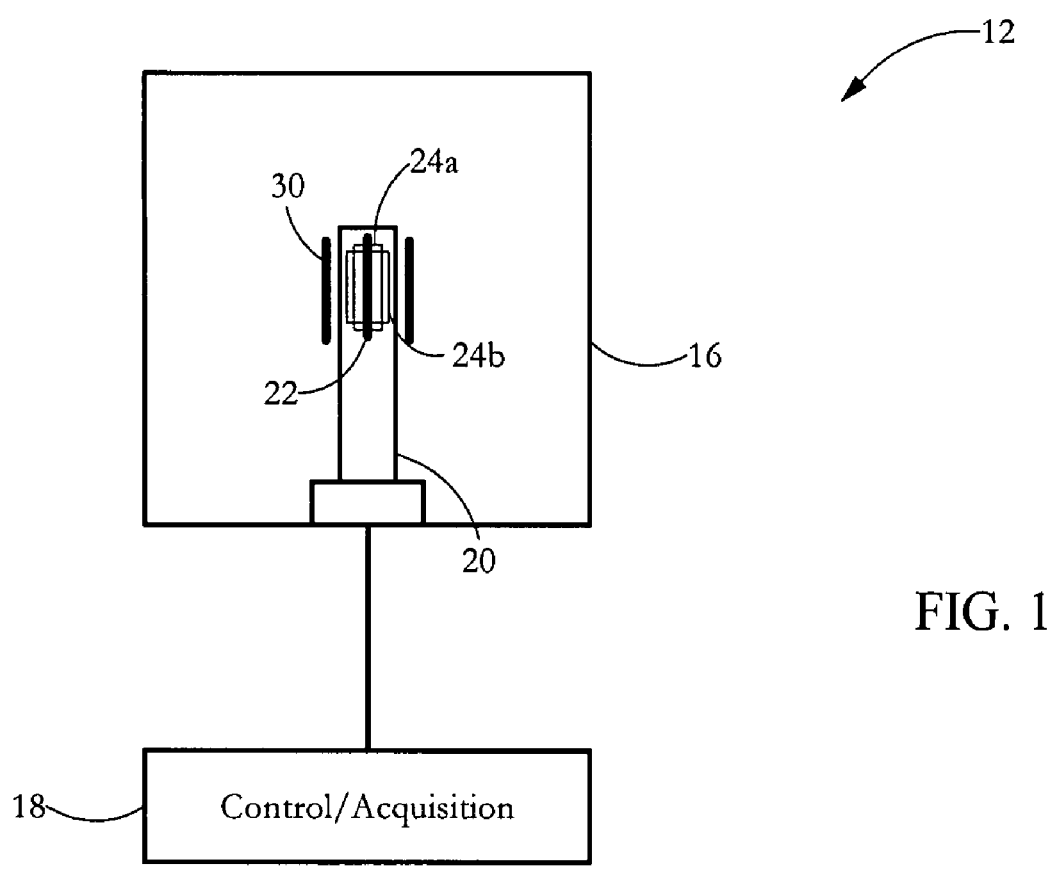
FIG. 1 is a schematic diagram of an exemplary NMR spectrometer according to some embodiments of the present invention.

FIG. 1 is a schematic diagram illustrating an exemplary nuclear magnetic resonance (NMR) spectrometer 12 according to some embodiments of the present invention. Spectrometer 12 comprises a magnet 16, an NMR probe 20 inserted in a cylindrical bore of magnet 16, and a control/acquisition system (console) 18 electrically connected to magnet 16 and probe 20. Probe 20 includes nested radio-frequency (RF) coils 24a-b and associated electrical circuit components. In some embodiments, one of the coils 24a-b is a proton coil, while the other is an X-coil. In some embodiments, probe 20 may include a single RF coil. A sample container 22 is positioned within probe 20, for holding an NMR sample of interest within coils 24a-b while measurements are performed on the sample. Sample container 22 can be a sample tube or a flow cell. A set of shim coils 30 laterally enclose coils 24a-b.

To perform a measurement, a sample is inserted into a measurement space defined within coils 24a-b. Magnet 16 applies a static magnetic field $B_0$ to the sample held within sample container 22. Shim coils 30 are used to correct spatial inhomogeneities in the static magnetic field $B_0$. Control/acquisition system 18 comprises electronic components configured to apply desired radio-frequency pulses to probe 20, and to acquire data indicative of the nuclear magnetic resonance properties of the samples within probe 20. Coils 24a-b are used to apply radio-frequency magnetic fields $B_1$ to the sample, and/or to measure the response of the sample to the applied magnetic fields. The RF magnetic fields are perpendicular to the static magnetic field. The same coil may be used for both applying an RF magnetic field and for measuring the sample response to the applied magnetic field. Alternatively, one coil may be used for applying an RF magnetic field, and another coil for measuring the response of the sample to the applied magnetic field.

Figure 2:
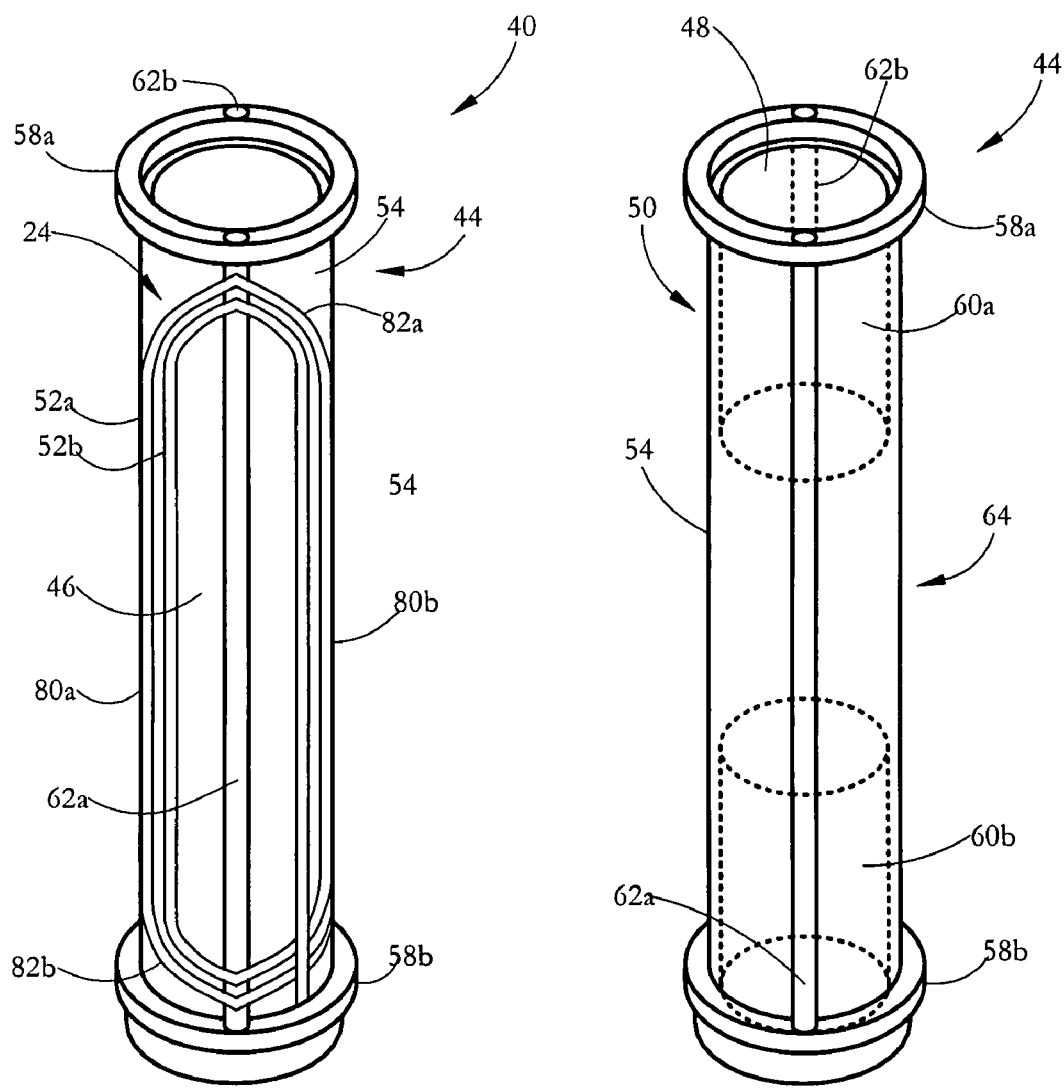
FIG. 2-A shows an isometric view of a radio-frequency (RF) NMR coil assembly including an arched, saddle-shaped RF coil according to some embodiments of the present invention.

FIG. 2-A shows an isometric view of a radio-frequency (RF) NMR coil assembly 40 including a support and shielding assembly 44 and an arched saddle-shaped RF coil 24 mounted on support/shielding assembly 44, according to some embodiments of the present invention. In the exemplary illustration of FIG. 2-A, RF coil 24 is a two-turn coil.

On each of two opposite lateral sides (front and back in FIG. 2-A), RF coil 24 includes two concentric loops 52a-b enclosing a laterally-facing coil window 46. Current flows through loops 52a-b in the same direction (clockwise or counterclockwise), such that the RF magnetic fields generated by the two loops reinforce each other. The direction of the RF magnetic field generated by coil 24 is generally in/out of the plane of the paper in FIG. 2-A. Each loop 52a-b includes straight longitudinal conductors 80a-b, and longitudinally-spaced, oppositely-facing connecting arches 82a-b providing a transverse connection between conductors 80a-b. Longitudinal conductors 80a-b extend along a sample measurement volume, while arches 82a-b are situated along a shielded longitudinal region of assembly 40. Each arch 82a-b follows and curves azimuthally around the lateral cylindrical surface of support assembly 44.

FIG. 2-B shows an isometric view of support/shielding assembly 44. Assembly 44 includes a generally longitudinal, cylindrical insulative coil support 50, and a pair of conductive shields 60a-b disposed along an internal lateral surface of coil support 50. Shields 60-a-b are formed by longitudinally-slotted cylindrical conductors disposed on opposite longitudinal sides of a measurement volume 64 accommodating a sample of interest. The central axis of each shield 60a-b is aligned with the longitudinal central axis of assembly 44. Sample containers (sample tubes and/or flow cells) containing NMR samples of interest are inserted and removed sequentially through a longitudinal bore 48 defined by support assembly 44, to place the samples within measurement volume 64. Shields 60a-b serve to reduce the parasitic excitation of the NMR samples due to RF pickup from coil leads or other conductive structures, and to shield the NMR samples from undesired external electric fields. Shields 60a-b also shield the static magnetic field within measurement volume 64 from the effects of current flow through arches 82a-b. Shields 60a-b may also provide additional distributed capacitance to coil assembly 40.

Coil support 50 includes two longitudinally-spaced rigid support rings 58a-b, a cylindrical tube 54 extending between support rings 58a-b, and a pair of longitudinal cylindrical conductor-spacer rods 62a-b adjacent to the external surface of tube 54 and extending between support rings 58a-b on opposite lateral sides of tube 54. Coil 24 is attached to rods 62a-b. Rods 62a-b lift coil 24 away from the surface of tube 54.

The materials and dimensions of the various components of assembly 44 may be chosen to be compatible with desired NMR applications and/or systems. In some embodiments, RF coil 24 a single susceptibility-compensated thin conductive foil. The foil can include one or multiple layers of material, and is monolithic along its main surface plane. In some embodiments, RF coil 24 may be formed from a susceptibility-compensated Pd—Cu or Al—Cu—Al foil, and shields 60a-b may be made of susceptibility-compensated Pd-plated copper. Other materials having susceptibilities of opposite signs can be used to yield a magnetic susceptibility equal to the magnetic susceptibility of air or vacuum. For example, rhodium, platinum, copper and stacks of such materials may be used for RF coil 24 and/or shields 60a-b. Support rings 58a-b may be made of a rigid polymer such as PCTFE (polychlorotrifluoroethylene, known under the trade name Kel-F®). In some embodiments, tube 54 is made of sapphire or quartz, and rods 62a-b are made of glass. RF coil 24 may be formed from a conductive sheet having thickness on the order of mils (milliinches, or about $2.5 \times 10^{-5}$ m), for example about 1 mil. The width of the conductors of RF coil 24 may be on the order of mm, for example about 1 mm. Tube 54 may have a diameter on the order of cm, for example about 1 cm, and a longitudinal extent on the order of cm to tens of cm, for example about 10 cm. Rods 62a-b may have a diameter on the order of mm, for example about 1 mm. The longitudinal extent of coil 24 may be on the order of cm to tens of cm, for example about 10 cm, while the longitudinal extent of each arch 82a-b may be on the order of cm, for example about 1-2 cm.

Figure 3:
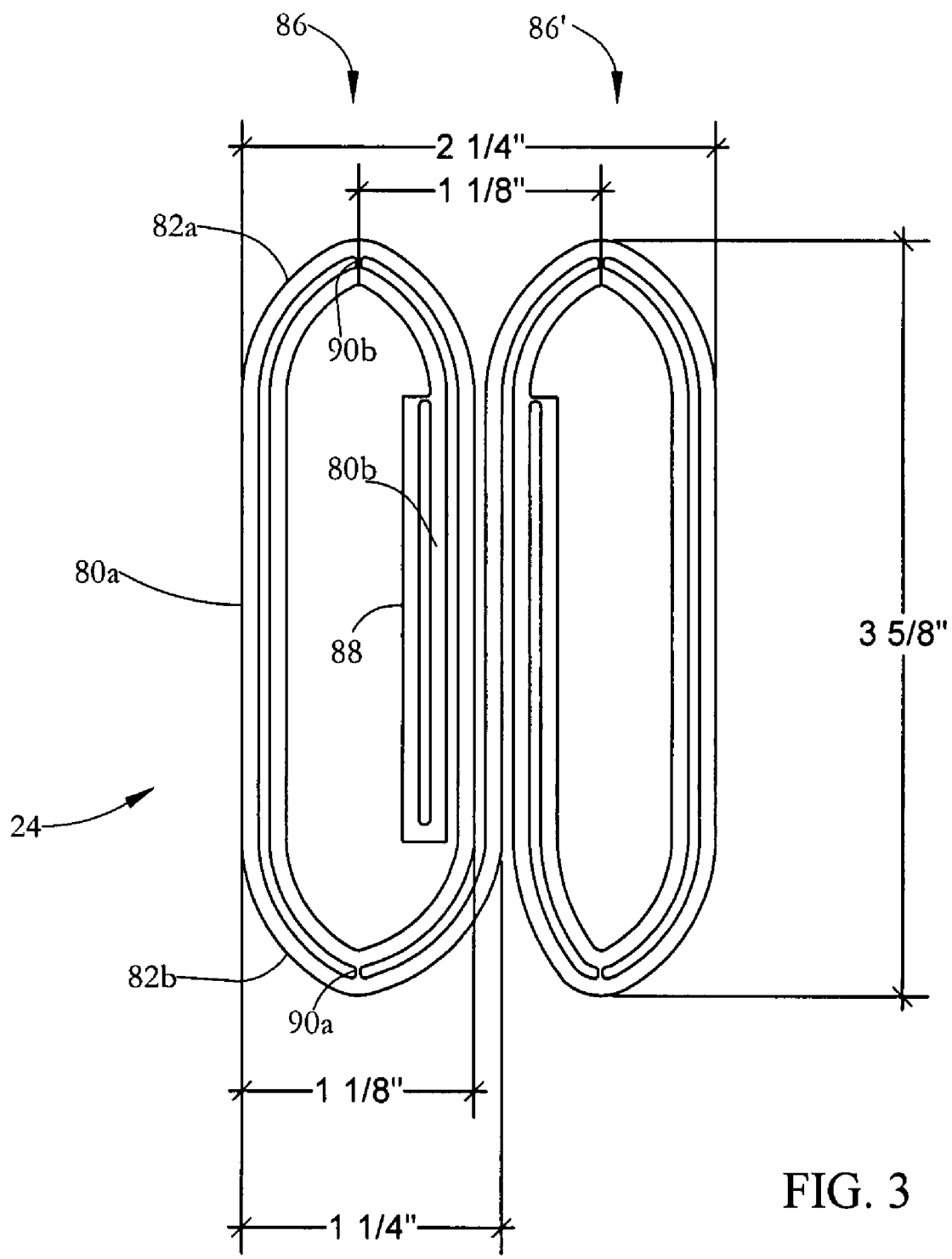
FIG. 3 shows a patterned foil used to make a coil such as the one shown in FIG. 2-B upon rolling about a longitudinal axis, according to some embodiments of the present invention.

FIG. 3 shows a patterned foil used to make coil 24 (FIG. 2-A) upon rolling about a longitudinal axis, according to some embodiments of the present invention. The patterned foil includes two two-turn loops 86, 86', each corresponding to one lateral side (front/back in FIG. 2-A) of coil 24. Loop 86 includes linear (straight) longitudinal conductors 80a-b and oppositely-facing interconnecting arches 82a-b connecting conductor 80a to conductor 80b. A longitudinal external connection lead 88 bends back along conductor 80b, and serves as one of the two external terminals of coil 24. A set of temporary stabilization bridges 90a-b interconnect the outer and inner conductors of loop 86a at the tips of arches 82a-b, respectively. Bridges 90a-b are defined during the patterning of coil 24, and are removed after the mounting of coil 24 on support assembly 44 (FIG. 2-B).

In some embodiments, coil 24 is made by patterning a planar susceptibility-compensated Al—Cu—Al trilayer foil. The patterned planar foil is rolled about a longitudinal axis to form coil 24 and mounted on support assembly (FIG. 2B). Temporary stabilization bridges 90a-b (FIG. 3) are subsequently removed.

FIG. 4-A-C show three exemplary coil arch shapes according to some embodiments of the present invention. Arched coils 124, 224, 324 include linear longitudinal conductors 180, 280, 380 and corresponding arches 182, 282, 382, respectively. Longitudinal conductors 180 extend along corresponding measurement volumes, while arches 182, 282, 382 extend along corresponding shielded regions. The interfaces between the measurement volumes and shielded areas are schematically illustrated in FIGS. 4-A-C at 160, 260 and 360, respectively. As shown, coils 124, 224, 324 are straight along interfaces 160, 260, 360, respectively. Arch 124 has a circular curvature, arch 224 has an elliptical curvature, and arch 324 is a gothic arch having an acutely-angled apex. Generally, a flatter design such as the one shown in FIG. 4-B may bring the transverse part of the coil relatively close to the shield/measurement volume interface, or, if the transverse part is moved further away from the interface, may lead to relatively long coil conductors along the shielded areas. A more acutely-shaped design such as the one shown in FIG. 4-C allows moving the transverse conductors away from the interface while introducing a relatively low additional coil length along the shielded area.

The exemplary arched RF coil designs described above allow achieving improved shimming performance in the context of the complex and often competing set of constraints that NMR RF coil designers generally take into account. Ideally, an NMR RF coil has a high quality factor (Q), a self-resonance frequency (SRF) well above the resonance frequency of the nucleus of interest, and is easy to shim so that the lineshape of the sample of interest is as narrow as possible. Using thick conductors (e.g. wires) for the coil may allow achieving high Q values, but may increase the difficulty of shimming. Shimming may be facilitated by forming the coil from a thin susceptibility-compensated foil, and additionally by using shields that screen parts of the coil that are particularly difficult to shim from the sample. Such shields generally introduce additional capacitance into the sample, which lowers the coil SRF and adversely affects the coil Q. The coil SRF may also be lowered by the introduction of additional coil conductor length, which increases the coil inductance and capacitance.

It has been observed that transverse conductors generally affect shimming and magnetic field homogeneity to a significantly larger extent than smooth, linear longitudinal conductors. In particular, even transverse conductors separated from a sample by a cylindrical shield may affect shimming. Effectively, the perturbation to the magnetic field caused by transverse conductors can be felt at a distance. While the sample region screened by shields causes little or no line broadening, the sample region just inside the coil window (near the shield edge) may be subject to a significant magnetic field perturbation if a transverse conductor is sufficiently close, resulting in a broader lineshape that may be difficult to shim out. An arched coil shape as described above allows situating the transversely-oriented parts of the coil away from the shield/measurement volume interface, where the coil conductors are substantially straight and longitudinal, without inordinately increasing the coil length and thus the additional inductance and capacitance introduced by the shielded part of the coil. The coil capacitance is further reduced by lifting the coil on longitudinal rods as described above, thus separating the coil from the dielectric support. Generally, sapphire has a dielectric constant much larger (e.g. about an order of magnitude larger) than air/vacuum, and thus even a small gap between the coil and the sapphire coil support tube allows substantially reducing the capacitance between the shields and coil.

Shimming considerations may be particularly complicated in systems using nested coils, such as dual-coil, dual broadband, and switchable probe systems. In such systems, the lineshape of the outer coil signals may be significantly degraded by the presence of the inner coil. In systems using nested coils, the exemplary arched-coil designs described above may be particularly useful for use as inner coils. Nevertheless, such arched coil designs may also be used in outer coils in nested coil systems.

The above embodiments may be altered in many ways without departing from the scope of the invention. For example, an RF coil may include a wire rather than a foil; such a wire may be susceptibility compensated. In some embodiments, larger numbers of lifting/support rods may be used, particularly if enhanced vibration dampening/control is desired. Accordingly, the scope of the invention should be determined by the following claims and their legal equivalents.

What is claimed is:

1. A nuclear magnetic resonance radio-frequency coil assembly comprising:
   a coil support; and
   a saddle-shaped nuclear magnetic resonance radio-frequency coil mounted on the coil support, the radio-frequency coil defining a pair of opposite, laterally-facing coil windows, each coil window including a pair of oppositely-facing arches at opposite longitudinal ends of said each coil window.

2. The coil assembly of claim 1, further comprising a pair of shields situated on opposite longitudinal sides of a measurement volume, each arch of the pair of arches being situated along a corresponding shield of the pair of shields.

3. The coil assembly of claim 2, wherein the radio-frequency coil defines substantially straight and longitudinal current paths along a pair of interfaces between the corresponding pair of shields and the measurement volume.

4. The coil assembly of claim 1, wherein the coil support comprises a plurality of coil support rods spaced apart along a circumference of a cylinder, the radio-frequency coil being mounted on the plurality of coil support rods.

5. The coil assembly of claim 1, wherein each of the arches has an acutely-angled apex.

6. The coil assembly of claim 1, wherein the radio-frequency coil is formed from a single, longitudinally-monolithic patterned foil.

7. The coil assembly of claim 1, wherein the radio-frequency coil comprises at least two coil turns.

8. A nuclear magnetic resonance apparatus comprising:
   a magnet for applying a static magnetic field to a sample held in a sample vessel;

a shim coil coupled to the magnet, for reducing a spatial inhomogeneity of the static magnetic field; and a saddle-shaped nuclear magnetic resonance radio-frequency coil coupled to the magnet, for applying a radio-frequency magnetic field to the sample, the radio-frequency coil defining a pair of opposite, laterally-facing coil windows, each coil window including a pair of oppositely-facing arches at opposite longitudinal ends of said each coil window.

9. The apparatus of claim 8, further comprising a pair of shields situated on opposite longitudinal sides of a measurement volume, each arch of the pair of arches being situated along a corresponding shield of the pair of shields.

10. The apparatus of claim 9, wherein the radio-frequency coil defines substantially straight and longitudinal current paths along a pair of interfaces between the corresponding pair of shields and the measurement volume.

11. The apparatus of claim 8, further comprising a radio-frequency coil support comprising a plurality of coil support rods spaced apart along a circumference of a cylinder, the radio-frequency coil being mounted on the plurality of coil support rods.

12. The apparatus of claim 8, wherein each of the arches has an acutely-angled apex.

13. The apparatus of claim 8, wherein the radio-frequency coil is formed from a single, longitudinally-monolithic patterned foil.

14. The apparatus of claim 8, wherein the radio-frequency coil comprises at least two coil turns.

15. A nuclear magnetic resonance method comprising:
employing a saddle-shaped nuclear magnetic resonance radio-frequency coil to apply a set of radio-frequency pulses to a sample, the radio-frequency coil defining a pair of opposite, laterally-facing coil windows, each coil window including a pair of oppositely-facing arches at opposite longitudinal ends of said each coil window; and detecting a response of the sample to the set of radio-frequency pulses.

16. The method of claim 15, further comprising shielding the sample from the arches using a pair of shields situated on opposite longitudinal sides of a measurement volume containing the sample.

17. The method of claim 16, wherein the radio-frequency coil defines substantially straight and longitudinal current paths along a pair of interfaces between the corresponding pair of shields and the measurement volume.

18. The method of claim 15, wherein the radio-frequency coil is mounted on a plurality of coil support rods spaced apart along a circumference of a cylinder.

19. The method of claim 15, wherein each of the arches has an acutely-angled apex.

20. The method of claim 15, wherein the radio-frequency coil is formed from a single, longitudinally-monolithic patterned foil.

21. The method of claim 15, wherein the radio-frequency coil comprises at least two coil turns.

22. The method of claim 15, further comprising applying to the sample a static magnetic field and a shimming magnetic field to reduce a spatial inhomogeneity of the static magnetic field.

23. A planar patterned foil defining a saddle-shaped nuclear magnetic resonance radio-frequency coil when rolled about a longitudinal axis, the radio-frequency coil defining a pair of opposite, laterally-facing coil windows, each coil window including a pair of oppositely-facing arches at opposite longitudinal ends of said each coil window.

* * * * *